(12) United States Patent  (10) Patent No.: US 8,324,950 B2
Kim et al.  (45) Date of Patent: Dec. 4, 2012

(54) SCHMITT TRIGGER CIRCUIT OPERATED BASED ON PULSE WIDTH

(75) Inventors: Sung Tae Kim, Incheon (KR); Sang Gyu Park, Gyunggi-do (KR); Kyung Uk Kim, Seoul (KR); Dong Ok Han, Gyunggi-do (KR); Seung Chul Pyo, Gyunggi-do (KR); Soo Woong Lee, Seoul (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 100 days.

(21) Appl. No.: 13/034,363

(22) Filed: Feb. 24, 2011

(65) Prior Publication Data

US 2012/0074999 A1  Mar. 29, 2012

(30) Foreign Application Priority Data

Sep. 23, 2010  (KR) .......................... 1020100094339

(51) Int. Cl.
  *G01R 29/02* (2006.01)
  *H03K 3/356* (2006.01)
(52) U.S. Cl. ............. 327/205; 327/206; 327/36; 327/37
(58) Field of Classification Search .................. None
  See application file for complete search history.

(56) References Cited

U.S. PATENT DOCUMENTS

| | | | | |
|---|---|---|---|---|
| 4,065,721 A | * | 12/1977 | Rabe | 327/509 |
| 4,529,892 A | * | 7/1985 | Reilly et al. | 327/75 |
| 4,698,829 A | * | 10/1987 | Di Giulio | 377/16 |
| 5,309,034 A | * | 5/1994 | Ishibashi | 327/174 |
| 5,402,063 A | * | 3/1995 | Kim | 324/750.3 |
| 5,646,565 A | * | 7/1997 | Tukidate | 327/174 |
| 5,708,375 A | * | 1/1998 | Lemmens | 327/36 |
| 7,365,586 B2 | * | 4/2008 | Kamei | 327/206 |
| 2004/0174923 A1 | * | 9/2004 | Sengoku et al. | 374/178 |

FOREIGN PATENT DOCUMENTS

KR  1020040080342 A  9/2004

* cited by examiner

*Primary Examiner* — Tuan T Lam
(74) *Attorney, Agent, or Firm* — Lowe Hauptman Ham & Berner LLP

(57) ABSTRACT

There are provided a Schmitt trigger circuit that has hysteresis characteristics in which a release point and an operating point are determined based on a width of an inputted pulse. The Schmitt trigger circuit may include a signal/pulse conversion unit that receives an analog signal to generate an input pulse having a width corresponding to a magnitude of the analog signal, a pulse width determination unit that compares the width of the input pulse generated in the signal/pulse conversion unit with a predetermined first threshold width and a second threshold width greater than the first threshold width to output state information indicating the compared result, and an output determination unit that outputs a high signal, when the width of the input pulse is changed from a state of being smaller than the second threshold width to a state of being greater than the second threshold width based on the state information, and outputs a low signal when the width of the input pulse is changed from a state of being greater than the first threshold width to a state of being smaller than the first threshold width based on the state information.

16 Claims, 6 Drawing Sheets

SCHMITT TRIGGER CIRCUIT OPERATED BASED ON PULSE WIDTH

CROSS-REFERENCE TO RELATED APPLICATIONS

This application claims the priority of Korean Patent Application No. 10-2010-0094339 filed on Sep. 29, 2010, in the Korean Intellectual Property Office, the disclosure of which is incorporated herein by reference.

BACKGROUND OF THE INVENTION

1. Field of the Invention

The present invention relates to a Schmitt trigger circuit, and more particularly, to a Schmitt trigger circuit having hysteresis characteristics, in which a release point and an operating point are determined based on a width of an inputted pulse.

2. Description of the Related Art

The field of sensors is closely connected to other industrial fields, and is currently utilized in various other fields having both industrial and consumer applications. Typically, various types of sensors such as a piezoelectric sensor, a magnetic sensor, and the like may be used, and most of the sensors may be implemented such that physical phenomena are able to be detected, and the detected physical phenomena may be converted to corresponding electrical signals to be outputted. For example, the piezoelectric sensor may detect physical momentum and output the detected physical momentum as an electrical signal, and the magnetic sensor may detect change in a magnetic field to output the detected change as an electric signal.

The above described sensors converting physical phenomena to the electrical signal may be mainly implemented in an analog type; however, a method has recently been developed in which digital elements may be partially mixed therein. Analog type sensors have advantages, in that an area for implementing the sensor is small and a sensor response speed is fast; however, analog type sensors also have disadvantages in that the power consumption thereof is large and the sensitivity thereof may be deteriorated.

More specifically, the conventional analog type sensor may amplify minute output signals obtained from a sensor element using an amplifier, and output an amplified analog waveform using a Schmitt trigger circuit. Since differential signals outputted from the sensor element typically use a differential amplifier, a circuit for removing an offset of the amplifier may be needed, thereby causing additional costs.

In addition, since the signals outputted from the sensor element may have noise contained therein, the Schmitt trigger circuit having hysteresis characteristics may be needed for the purpose of output stabilization. In the Schmitt trigger circuit used in the conventional analog type sensor, it may be significantly difficult to accurately set and match a release point and an operating point. Due to this problem, sensitivity may be deteriorated, and thereby changes between the release point and the operating point may be increased. Also, when sweeping of a gap between the release point and the operating point occurs, power consumption may be rapidly increased.

SUMMARY OF THE INVENTION

An aspect of the present invention provides a Schmitt trigger circuit which has hysteresis characteristics, in which a release point and an operating point are determined based on a width of an input pulse.

According to an aspect of the present invention, there is provided a Schmitt trigger circuit that is operated based on a pulse width, including: a signal/pulse conversion unit that receives an analog signal to generate an input pulse having a width corresponding to a magnitude of the analog signal; a pulse width determination unit that compares the width of the input pulse generated in the signal/pulse conversion unit with a predetermined first threshold width and a second threshold width greater than the first threshold width to output state information indicating the compared result; and an output determination unit that outputs a high signal, when the width of the input pulse is changed from a state of being smaller than the second threshold width to a state of being greater than the second threshold width based on the state information, and outputs a low signal when the width of the input pulse is changed from a state of being greater than the first threshold width to a state of being smaller than the first threshold width based on the state information.

The signal/pulse conversion unit may include: a first inverter that delays a change in a state of an inputted arbitrary clock signal for a first delay time and then inversion-outputs the change in the state; a second inverter that delays the change in the state of the clock signal for a second delay time and then inversion-outputs the change in the state; a first delay control unit that adjusts the first delay time; a second delay control unit that adjusts the second delay time; and a pulse generating unit that generates an input pulse having a width corresponding to a difference between the first delay time and the second delay time.

Here, the analog signal may be a differential analog signal including a first analog signal and a second analog signal, the first delay control unit may adjust the first delay time based on a magnitude of the first analog signal, and the second delay control unit may adjust the second delay time based on a magnitude of the second analog signal.

The first inverter may include a first P-channel Metal-Oxide Semiconductor (PMOS) having a source connected to a power supply voltage, a first N-channel MOS (NMOS) having a drain connected to a drain of the first PMOS and a gate connected to a gate of the first PMOS, and a first capacitor connected between the drain of the first PMOS and a ground. Also, the second inverter may include a second PMOS having a source connected to the power supply voltage, a second NMOS having a drain connected to a drain of the second PMOS and a gate connected to a gate of the second PMOS, and a second capacitor connected between the drain of the second PMOS and the ground. Also, the first delay control unit may include a third NMOS having a drain connected to a source of the first NMOS and a source connected to the ground, and the second delay control unit may include a fourth NMOS having a drain connected to a source of the second NMOS and a source connected to the ground. Also, the pulse generating unit may include an exclusive OR (XOR) gate that performs an XOR operation on a drain voltage of the first PMOS and a drain voltage of the second PMOS to thereby output a result of the performed XOR operation. Here, each of the first analog signal and the second analog signal may be applied to a gate of the third NMOS and a gate of the fourth NMOS, and the XOR gate may output the input pulse having a width corresponding to a difference in an output time of the signal of a low state outputted from the drain of the first PMOS and the drain of the second PMOS when the clock signal of a high state is simultaneously applied to the gate of the first PMOS and the gate of the second PMOS.

The pulse width determination unit may include: a plurality of delay circuit units that are connected to each other in series so that the input pulse is sequentially delayed for a unit delay time; and a first AND gate and a second AND gate that receive two pulses from among a group including the input pulse and a plurality of delayed pulses outputted from each of the plurality of delay circuit units to thereby output an overlapped portion between the two pulses as a pulse type.

Here, the pulses inputted to each of the first AND gate and the second AND gate include at least one of mutually different pulses, the first AND gate may output the pulse when the width of the input pulse is larger than m times (m being a natural number) the unit delay time, the second AND gate may output the pulse when the width of the input pulse is larger than n times (n being a natural number) the unit delay time, the first threshold width may be m times the unit delay time, the second threshold width may be n times the unit delay time, and an output of each of the first AND gate and the second AND gate may be the state information.

The plurality of delay circuit units may include (m+n) delay circuit units that are connected to each other in series. Here, the first AND gate may receive an output of an m-th delay circuit unit and an output of an (m+n)-th delay circuit unit, and perform a mutual OR operation on each of the received outputs to thereby output a result of the performed mutual OR operation, and the second AND gate may receive the input pulse and the output of the (m+n)-th delay circuit unit, and perform the mutual OR operation on the received input pulse and output of the (m+n)-th delay circuit unit to thereby output a result of the performed mutual OR operation.

The delay circuit unit may include a PMOS having a source connected to a power supply voltage, an NMOS having a drain connected to a drain of the PMOS and a gate connected to a gate of the PMOS, and a capacitor connected between the drain of the PMOS and a ground.

The output determination unit may include: a switch unit that selects one of the output of the first AND gate and the output of the second AND gate according to a control signal, and outputs the selected one; and a logical circuit unit that receives the output of the switch unit and a reference clock, outputs a signal of a high state when a pulse is generated from the output of the switch unit within the reference clock, and outputs a signal of a low state when the pulse is not generated from the output of the switch unit within the reference clock. Here, the output of the logical circuit unit may be the control signal.

The switch unit may output the output of the first AND gate when the control signal is in the high state, and output the output of the second AND gate when the control signal is in the low state.

The logical circuit unit may include: an RS flip-flop that has an "S" terminal to which the output of the switch unit is inputted and an "R" terminal to which an opposite phase signal of the reference clock is inputted; and a fall edge triggered D flip-flop that has a "D" terminal, to which an output of the RS flip-flop is inputted and a clock input terminal to which the reference clock is inputted. Here, an output of the fall edge triggered D flip-flop may be an output of the output determination unit.

According to another aspect of the present invention, there is a provided a Schmitt trigger circuit that is operated according to a pulse width, including: a signal/pulse conversion unit that receives an analog signal to generate an input pulse having a width corresponding to a magnitude of the analog signal; a pulse width determination unit that includes (m+n) delay circuit units connected to each other in series so that the input pulse is sequentially delayed for a unit delay time, a first AND gate receiving an output of an m-th delay circuit unit and an output of an (m+n)-th delay circuit unit and performing a mutual OR operation on the received outputs to thereby output a result of the performed mutual OR operation, and a second AND gate receiving the input pulse and the output of the (m+n)-th delay circuit unit, and performing the mutual OR operation on the received input pulse and output of the (m+n)-th delay circuit unit to thereby output a result of the performed mutual OR operation; and an output determination unit that includes a switch unit receiving a control signal, outputting an output of the first AND gate when the control signal is in a high state, and outputting an output of the second AND gate when the control signal is in a low state, and a logical circuit unit receiving the output of the switch unit and a reference clock, outputting a signal of a high state when a pulse is generated from the output of the switch unit within the reference clock, and outputting a signal of a low state when the pulse is not generated from the output of the switch unit within the reference clock, an output of the logical unit being the control signal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Hereinafter, exemplary embodiments will be described in detail with reference to the accompanying drawings so that they could be easily practiced by those skilled in the art to which the present invention pertains. However, in describing the exemplary embodiments of the present invention, detailed descriptions of well-known functions or constructions are omitted so as not to obscure the description of the present invention with unnecessary detail.

Figure 1:
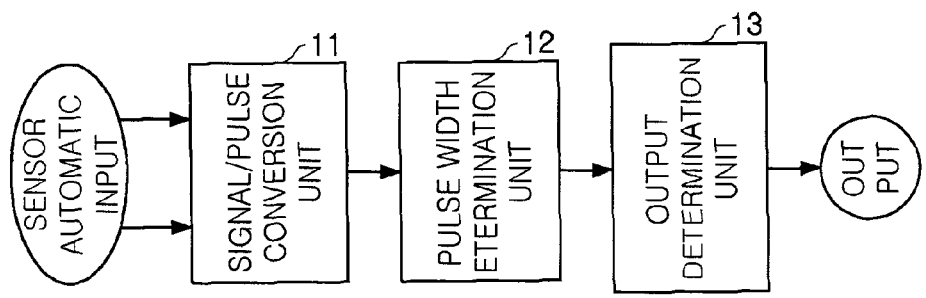
FIG. 1 is a block configuration diagram showing a Schmitt trigger circuit that is operated based on a pulse width according to an exemplary embodiment of the present invention.

FIG. 1 is a block configuration diagram showing a Schmitt trigger circuit that is operated based on a pulse width according to an exemplary embodiment of the present invention.

Referring to FIG. 1, a Schmitt trigger circuit according to an exemplary embodiment of the present invention includes a signal/pulse conversion unit 11 that converts an analog signal to a pulse to output the pulse, a pulse width determination unit 12 that determines a size of a pulse width outputted from the signal/pulse conversion unit 11, and an output determination unit 13 that determines a final output in accordance with the size of the pulse width determined in the pulse width determination unit 12.

The signal/pulse conversion unit 11 may receive the analog signal, and generate an input pulse having a width corresponding to a magnitude of the analog signal to thereby output the generated input pulse. According to an embodiment of the present invention, the analog signal inputted to the signal/pulse conversion unit 11 may be a differential signal including a first analog signal and a second analog signal. The signal/pulse conversion unit 11 may generate a pulse having a width corresponding to a difference in the magnitude between the first analog signal and the second analog signal.

Figure 2A:
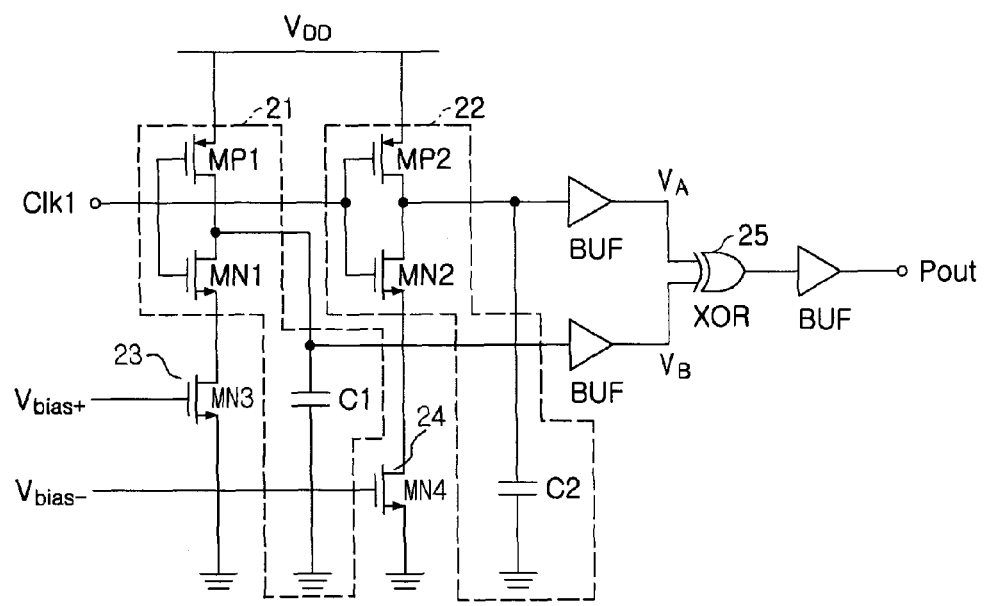
FIG. 2A is a circuit diagram of a signal/pulse conversion unit 11 applied to a Schmitt trigger circuit that is operated based on a pulse width according to an exemplary embodiment of the present invention.

FIG. 2A is a circuit diagram of the signal/pulse conversion unit 11 applied to a Schmitt trigger circuit that is operated based on a pulse width according to an exemplary embodiment of the present invention.

As shown in FIG. 2A, the signal/pulse conversion unit 11 may include a first inverter 21, a second inverter 22, a first delay control unit 23, a second delay control unit 24, and a pulse generating unit 25. Here, the first inverter 21 may delay a change in a state of an inputted arbitrary clock signal (Clk 1) for a first delay time and then inversion-outputs the change in the state, and the second inverter 22 may delay the change in the state of the clock signal (Clk 1) for a second delay time and then inversion-outputs the change in the state. Also, the first delay control unit 23 may adjust the first delay time, and the second delay control unit 24 may adjust the second delay time. Also, the pulse generating unit 25 may generate an input pulse having a width corresponding to a difference between the first delay time and the second delay time.

A signal inputted to the signal/pulse conversion unit 11 may be a differential analog signal, the first delay control unit 23 may adjust the first delay time based on a magnitude of a first analog signal (V+) included in the differential analog signal, and the second delay control unit 24 may adjust the second delay time based on a magnitude of a second analog signal (V−) included in the differential analog signal.

The first inverter 21 may include a first P-channel Metal-Oxide Semiconductor (PMOS) (MP1) having a source connected to a power supply voltage ($V_{DD}$), a first N-channel MOS (NMOS) (MN1) having a drain connected to a drain of the first PMOS (MP1) and a gate connected to a gate of the first PMOS (MP1), and a first capacitor (C1) connected between the drain of the first PMOS (MP1) and a ground.

The second inverter 22 may include a second PMOS (MP2) having a source connected to the power supply voltage ($V_{DD}$), a second NMOS (MN2) having a drain connected to a drain of the second PMOS (MP2) and a gate connected to a gate of the second PMOS (MP2), and a second capacitor (C2) connected between the drain of the second PMOS (MP2) and the ground.

Each of the first delay control unit 23 and the second delay control unit 24 may include a third NMOS (NM3) having a drain connected to a source of the first NMOS (MN1) and a source connected to the ground, and a fourth NMOS (NM4) having a drain connected to a source of the second NMOS (NM2) and a source connected to the ground. Each of the first analog signal (V+) and the second analog signal (V−) is applied to the gate of the third NMOS (NM3) and the gate of the fourth NMOS (NM4).

The pulse generating unit 23 may include an exclusive OR (XOR) gate that performs an XOR operation on a drain voltage of the first PMOS (MP1) and a drain voltage of the second PMOS (MP2) to thereby output a result of the performed XOR operation.

'BUF' of FIG. 2A may simply indicate a buffer that temporarily stores signals, and may not be associated with the main technical ideas of the present invention. Thus, a detailed description thereof will be omitted.

Figure 2B:
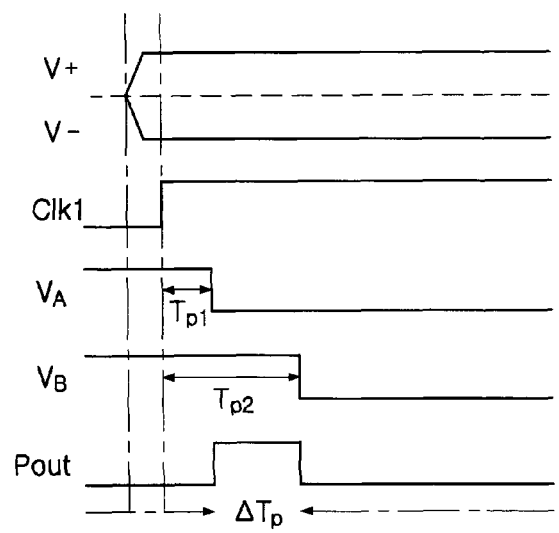
FIG. 2B is a waveform diagram showing a signal waveform of each node in the circuit of FIG. 2A.

FIG. 2B is a waveform diagram showing a signal waveform of each node in the circuit of FIG. 2A.

As shown in FIG. 2B, when the clock signal (Clk1) inputted to each of the first inverter 21 and the second inverter 22 moves from a low state to a high state, each interver may output a signal of the low state after different delay times have elapsed. The pulse generating unit 25 may generate a pulse having a width corresponding to a difference in the delay times between the first interver 21 and the second inverter 22, and output the generated pulse.

Referring again to FIG. 1, the pulse width determination unit 12 may compare the width of the input pulse generated in the signal/pulse conversion unit 11 with a predetermined first threshold width and a second threshold width greater than the first threshold width to thereby output state information indicating the compared result.

Figure 3A:
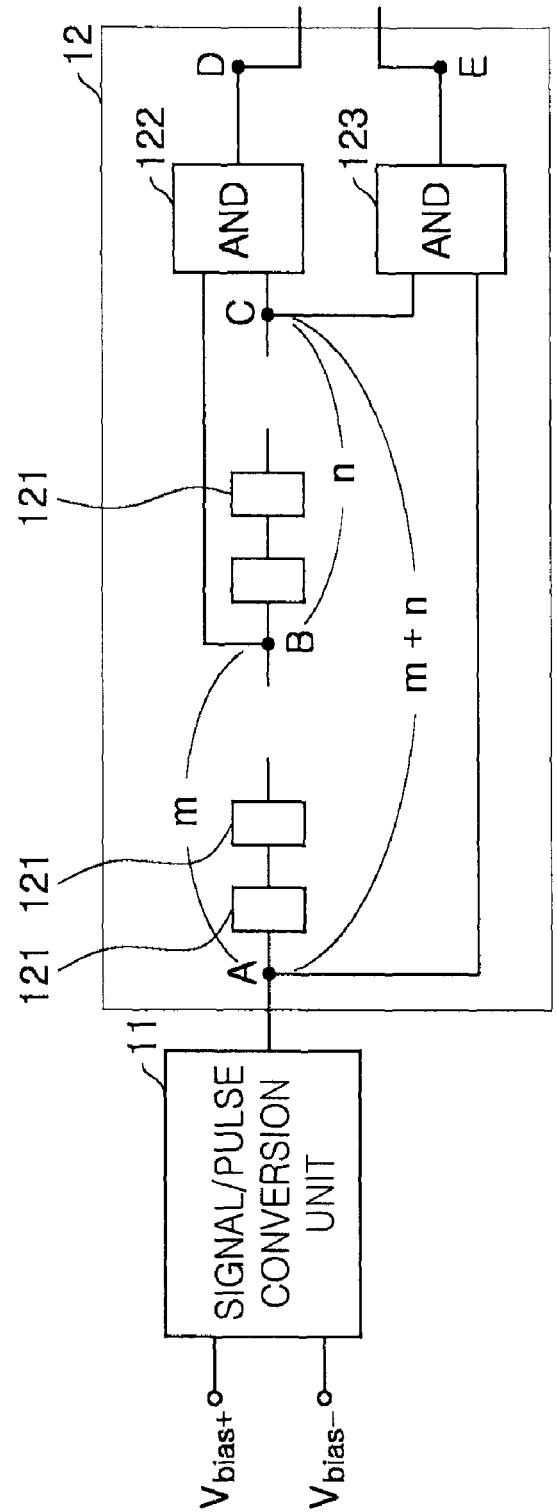
FIG. 3A is a block configuration diagram showing a detailed configuration of a pulse width determination unit applied to a Schmitt trigger circuit that is operated based on a pulse width according to an exemplary embodiment of the present invention.

FIG. 3A is a block configuration diagram showing a detailed configuration of a pulse width determination unit applied to a Schmitt trigger circuit that is operated based on a pulse width, according to an exemplary embodiment of the present invention.

Referring to FIG. 3A, the pulse width determination unit 12 include a plurality of delay circuit units 121 connected to each other in series, a first AND gate 122, and a second AND gate 123.

The plurality of delay circuit units 121 may sequentially delay the input pulse for a predetermined unit delay time. For example, when the unit delay time is assumed to be "1", the input pulse may be delayed by a delay time of "1" while passing through one delay circuit unit. Accordingly, when the input pulse passes through an m-th delay circuit unit of the delay circuit units connected to each other in series, a pulse delayed by m may be outputted from the m-th delay circuit unit.

Each of the two AND gates 122 and 123 may receive two pulses from a group including the input pulse and a plurality of delayed pulses outputted from each of the plurality of delay circuit units, and output an overlapped portion between the two pulses as a pulse type. For example, the first AND gate 122 may receive a pulse outputted from the m-th delay circuit unit and a pulse outputted from an (m+n)-th delay circuit unit, and output the overlapped portion between the two pulses as the pulse type. Also, the second AND gate 123 may receive the input pulse inputted from the signal/pulse conversion unit 11 and the pulse outputted from the (m+n)-th delay circuit unit, and output the overlapped portion between the two pulses as the pulse type. Here, m and n used throughout the specification is a natural number.

By selecting the signal inputted to each of the two AND gates 122 and 123, a first threshold width and a second threshold width may be determined, and the signal outputted from each of the two AND gates 122 and 123 may be state information indicating a result obtained by comparing the pulse width of the input pulse with each of the first threshold width and the second threshold width.

Figure 3B:
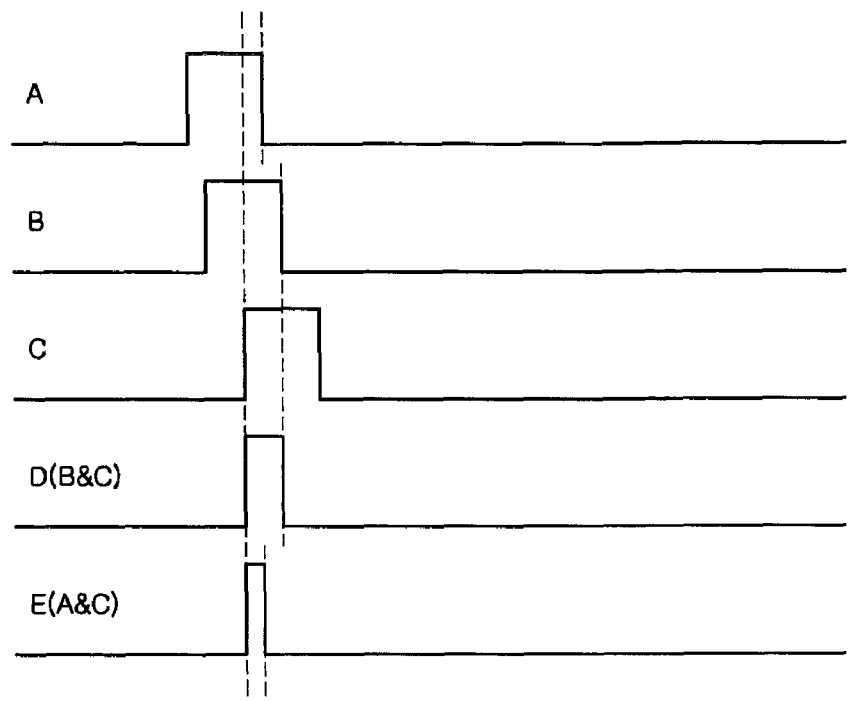
FIG. 3B is a waveform diagram showing a signal waveform of each node in the circuit of FIG. 3A.

FIG. 3B is a waveform diagram showing a signal waveform of each node in the circuit of FIG. 3A. Reference letters "A" to "E" applied to waveforms shown in FIG. 3B may indicate the waveforms of nodes having the same reference numerals as shown in FIG. 3A "A" denotes an input pulse, "B" denotes a pulse in which the input pulse is delayed by m times the unit delay time by m delay circuit unit connected to each other in series, and "C" denotes a pulse in which the input pulse is delayed by m times the unit delay time by (m+n) delay circuit unit connected to each other in series. A first AND gate 122 may output a signal (D) in which an overlapped region of the pulses of "B" and "C" is indicated as a high state. In this instance, the first AND gate 122 may always output the pulse when a magnitude of the input pulse is more than or equal to n times the unit delay time. Similarly, a second AND gate 123 may output a signal (E) in which an overlapped region of the input pulse and the pulse of "C" is indicated a the high state. In this instance, the second AND gate 123 may always output the pulse when the magnitude of the input pulse is more than or equal to (m+n) times the unit delay time.

In this manner, the pulse width determination unit 12 may output state information corresponding to a result obtained by comparing each of the first threshold width corresponding to n times the unit delay time and the second threshold width corresponding to (m+n) times the unit delay time with the pulse width of the input pulse, using the plurality of delay circuit units and the AND gate.

According to an embodiment, the delay circuit unit 121 applied to the pulse width determination unit 12 may include the inverters 21 and 22 shown in FIG. 2A. That is, a single delay circuit unit 121 may be configured in such a manner that a sum of the delay time of respective inverters is given as the unit delay time by connecting two inverters in series. Similar to a structure of the inverter shown in FIG. 2A, the delay circuit unit 121 may include a PMOS having a source connected to a power supply voltage, an NMOS having a drain connected to a drain of the PMOS and a gate connected to a gate of the PMOS, and a capacitor connected between the drain of the PMOS and a ground.

Referring again to FIG. 1, the output determination unit 13 may output a high signal, when the width of the input pulse is changed from a state of being smaller than the second threshold width to a state of being greater than the second threshold width based on the state information, and output a low signal when the width of the input pulse is changed from a state of being greater than the first threshold width to a state of being smaller than the first threshold width, based on the state information. The output determination unit 13 may maintain a state prior to the change in the width of the input pulse, except for when the width of the input pulse is changed from the state of being smaller than the second threshold width to the state of being greater than the second threshold width, and when the width of the input pulse is changed from the state of being greater than the first threshold width to the state of being smaller than the first threshold width.

Figure 4:
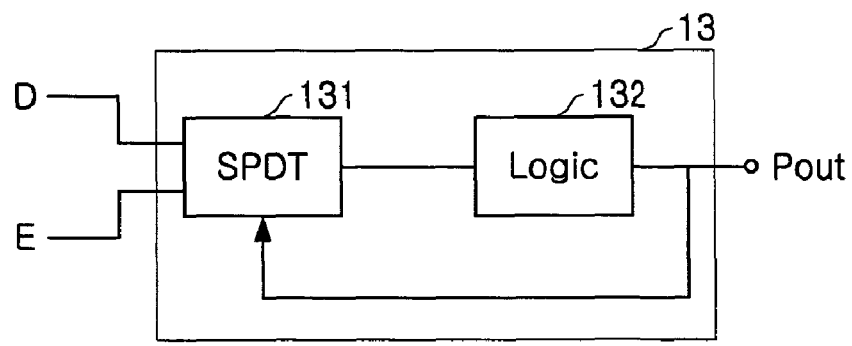
FIG. 4 is a block diagram showing a detailed configuration of an output determination unit applied to a Schmitt trigger circuit that is operated based on a pulse width according to an exemplary embodiment of the present invention.

FIG. 4 is a block diagram showing a detailed configuration of the output determination unit 13 applied to a Schmitt trigger circuit that is operated based on a pulse width according to an exemplary embodiment of the present invention. As shown in FIG. 4, the output determination unit 13 includes a switch unit 131 and a logical circuit unit 131. Here, the switch unit 131 may select one of the output (D) of the first AND gate and the output (E) of the second AND gate according to a control signal, and output the selected one. The logical circuit unit may receive an output of the switch unit 131 and a reference clock, output a signal of a high state when a pulse is generated from the output of the switch unit 131 within the reference clock, and output a signal of a low state when the pulse is not generated from the output of the switch unit 131 within the reference clock. Here, an output (Pout) of the logical circuit unit 132 may be an output of the Schmitt trigger circuit that is operated based on a pulse width according to an embodiment, and at the same time, may be the control signal inputted to the switch unit 131.

The switch unit 131 may output an output of the first AND gate when the control signal is in a high state, and output an output of the second AND gate when the control signal is in a low state.

Figure 5A:
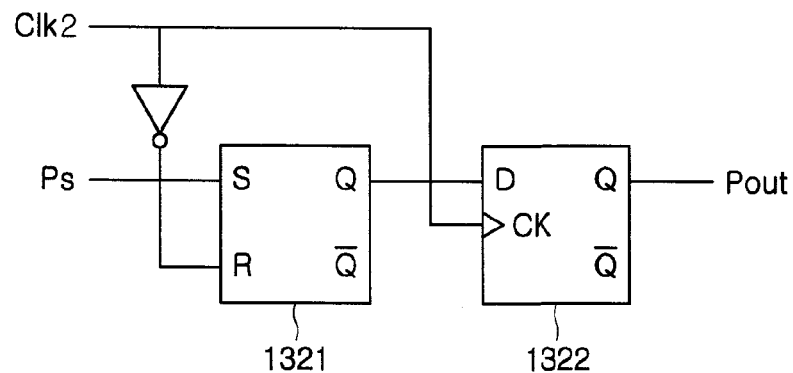
FIG. 5A is a detailed block diagram showing a logical circuit unit within an output determination unit applied to a Schmitt trigger circuit that is operated based on a pulse width according to an exemplary embodiment of the present invention.

FIG. 5A is a detailed block diagram showing the logical circuit unit 132 within the output determination unit 13 applied to a Schmitt trigger circuit that is operated based on a pulse width according to an exemplary embodiment of the present invention. As shown in FIG. 5A, the logical circuit unit 132 includes an RS flip-flop 1321 hat has an "S" terminal in which the output (Ps) of the switch unit 131 inputs and an "R" terminal in which an opposite phase signal of the reference clock (Clk2) inputs, and a fall edge triggered D flip-flop 1322 that has a "D" terminal in which an output of the RS flip-flop 1321 inputs and a clock input terminal in which the reference clock (Clk2) inputs.

Figure 5B:
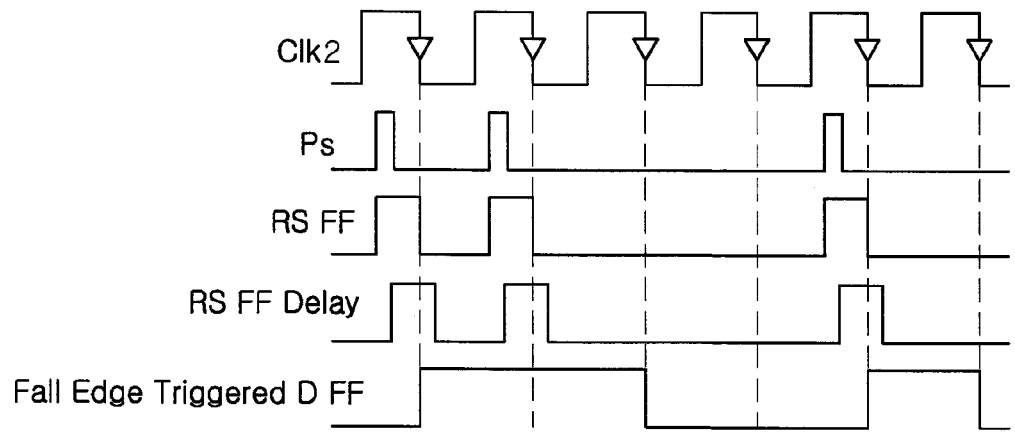
FIG. 5B is a waveform diagram showing operations of the logical circuit unit of FIG. 5A.

FIG. 5B is a waveform diagram showing operations of the logical circuit unit of FIG. 5A. As shown in FIG. 5B, when a pulse is generated in the signal (Ps) inputted from the switch unit 131 within the reference clock (Clk2), the opposite phase signal of the reference clock (Clk2) inputs to the R terminal of the RS flip-flop 1321, and the output (Ps) of the switch unit 131 is applied to the S terminal, and thereby the RS flip-flop 1321 may output a pulse to be maintained in the high state from a ringing edge of a pulse, existing in the signal (Ps) inputted from the switch unit 131, to a falling edge of the reference clock. In a case in which the output of the RS flip-flop 1321 is delayed to input to the D terminal of the D flip-flop 1322, and the input of the D terminal of the D flip-flop 1322 is in the high state, the output of the D flip-flop 1322 may output the high state when the falling edge of the reference clock (Clk2) is generated. The output of the D flip-flop 1322 may output the low state when the input of the D terminal moves to the low state in the falling edge of the reference clock (Clk2).

Figure 6:
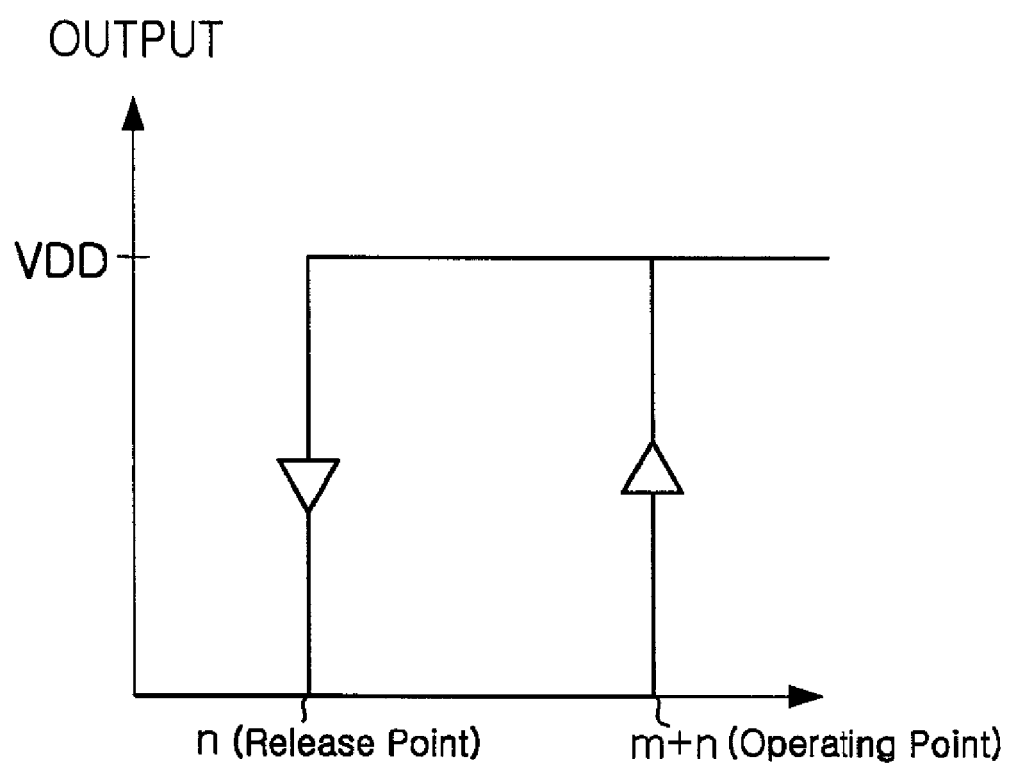
FIG. 6 is a graph showing hysteresis characteristics of an output of a Schmitt trigger circuit that is operated based on a pulse width according to an exemplary embodiment of the present invention.

FIG. 6 is a graph showing hysteresis characteristics of an output of a Schmitt trigger circuit that is operated based on a pulse width according to an exemplary embodiment of the present invention.

The above described Schmitt trigger circuit that is operated based on pulse width according to an embodiment may have hysteresis characteristics according to the pulse width, as shown in FIG. 6. That is, according to the embodiments of FIGS. 1 to 5, an output of the Schmitt trigger circuit may be changed from the low state to the high state when the width of the input pulse is greater than (m+n) times (second threshold width) of the unit delay time, and the output of the Schmitt trigger circuit may be changed from the high state to the low state when the width of the input pulse is smaller than n times the unit delay time.

Operations and functional effects of the Schmitt trigger circuit having the above described configuration, which is operated based on pulse width according to an embodiment, will be herein described in more detail.

First, as shown in FIG. 1, differential analog signals indicating a detected magnitude of a specific physical quantity, which output from a sensor element such as a hole sensor, etc., may be an input of the Schmitt trigger circuit that is operated based on pulse width according to an embodiment.

The differential analog signals outputted from the sensor element may be input to the signal/pulse conversion unit 11 within the Schmitt trigger circuit that is operated based on pulse width according to an embodiment of the present invention.

As shown in FIG. 2, the first analog signal (V+) and the second analog signal (V−) which constitute the differential analog signals may be respectively input to the delay control units 23 and 24 respectively connected to the inverters 21 and 22. The inverters 21 and 22 shown in FIG. 2 may be implemented in such a manner that the drain and the gate of a P-channel MOS field effect transistor (MOSFET) (MP1, MP2) and an N-channel MOSFET (MN1, MN2) may be connected to each other, an arbitrary clock (Clk1) may be received to a gate connection node, and a capacitor capacitors (C1, C2) may be connected to a drain connection node, so that an inverse signal of a signal delayed for a predetermined period of time outputs to the drain connection node.

It may be known that a delay time during which the inverse signal outputs from the inverters 21 and 22, each having the above described circuit configuration, may be determined by a capacitance of the capacitor (C1, C2) and a voltage amplitude between source terminals of the P-channel MOSFET (MP1, MP2) and the N-channel MOSFET (MN1, MN2) which are connected to each other. The first analog signal (V+) and the second analog signal (V−) which have different magnitudes may be input to the delay control units 23 and 24 each including the N-channel MOSFET. That is, the first analog signal (V+) and the second analog signal (V−) may be input to a gate of a third N-channel MOSFET (MN3) and a gate of a fourth N-channel MOSFET (MN1, MN2). Also, the gate of the third N-channel MOSFET (MN3) and the gate of the fourth N-channel MOSFET (MN4) may generate resistance having different magnitudes in sources of the first and second N-channel MOSFETs (MN1, MN2) of the respective inverters 21 and 22 due to a difference in the magnitudes between the first analog signal (V+) and the second analog signal (V−). Thus, a delay time of a reverse signal of the clock (Clk1) outputted from the respective inverters 21 and 22 may be changed depending to the magnitude of each of the first analog signal (V+) and the second analog signal (V−).

Delay signals outputted as different delay times depending on the magnitudes of the first analog signal (V+) and the second analog signal (V−) may be input to the pulse generating unit 25. The pulse generating unit 25 may perform an exclusive OR (XOR) operation on the delayed reverse signals outputted from the first inverter 21 and the second inverter 22.

Operations of the above described signal/pulse conversion unit 11 may be shown in FIG. 2A as a waveform diagram. A detection voltage (V+, V−) may be generated in the type of the differential signal, and the detection voltage may be input to the gate of the third N-channel MOSFET (MN3) and the gate of the fourth N-channel MOSFET (MN4), which constitute the delay control units 23 and 24. Due to a difference in the voltages between the gate of the third N-channel MOSFET (MN3) and the gate of the fourth N-channel MOSFET (MN4), resistance having different magnitudes may be generated in the sources of the first and second N-channel MOSFETs (MN1, MN2) of the inverters 21 and 22, thereby causing a difference in the delay times during which an output of each of the inverters 21 and 22 is generated. That is, when the clock (Clk1) is changed from the low state to the high state, a reverse signal of the low state may output after a predetermined delay time of each of the inverters 21 and 22, and difference delay times may be set due to the difference in the resistance of the delay control units 23 and 24 respectively connected to the inverters 21 and 22. For example, a delay time '$T_{P2}$' may be set by the first inverter 21, and a delay time '$T_{P1}$' may be set by the second inverter 22. The pulse generating unit 25 including an XOR gate may generate a pulse having a width ($\Box T_P$) corresponding to an interval in which two reverse signals ($V_A$ and $V_B$) are indifferent states, and output the generated pulse. That is, the pulse outputted from the signal/pulse conversion unit 11 may output an input pulse having a pulse width corresponding to a magnitude of an analog signal outputted from the sensor element, more specifically, corresponding to a difference in magnitudes of differential analog signals.

Subsequently, the input pulse may be input to the pulse width determination unit 12. The pulse width determination unit 12 includes the plurality of delay circuit units 121 connected to each other in series, the first AND gate 122, and the second AND gate 123. The plurality of delay circuit units 121 may delay signals inputted during the same unit delay time, and the first AND gate 122 and the second AND gate 123 may receive two signals having at least one mutually different signal from among a group consisting of the input pulse and output signals of each of the plurality of delay circuit units 121, and perform an AND operation on the inputted two signals.

In an embodiment shown in FIG. 3A, (m+n) delay circuit units 121 in total may be provided, the first AND gate 122 may receive an output of an m-th delay circuit unit and an output of an (m+n)-th delay circuit unit, and the second AND gate 123 may receive the input pulse and an output of the (m+n)-th delay circuit unit. In this case, as shown in the waveform diagram of FIG. 3B, the first AND gate 122 may receive a signal (B) in which the input pulse is delayed by m times the unit delay time, and a signal (C) in which the input pulse is delayed by (m+n) times the unit delay time to thereby output a mutually overlapped portion. In this instance, when a width of the input pulse is greater than n times the unit delay time, the first AND gate 122 may always output a pulse; however, when the width of the input pulse is smaller than n times the unit delay time, an overlapped pulse may not be generated in "B" and "C" nodes, whereby the pulse may not be generated. Similarly, the second AND gate 123 may receive the input pulse (A) and a signal (C) in which the input pulse is delayed by (m+n) times the unit delay time to thereby output a mutually overlapped portion. In this instance, when the width of the input pulse is greater than (m+n) times the unit delay time, the second AND gate 123 may always output a pulse; however; when the width of the input pulse is smaller than (m+n) times the unit delay time, an overlapped pulse may not be generated in "A" and "B" nodes, whereby the pulse may be not generated. Accordingly, the first AND gate 122 may output the pulse when the input pulse is greater than n times the unit delay time, and the second AND gate 123 may output the pulse when the input pulse is greater than (m+n) times the unit delay time.

Consequently, according to an embodiment, the pulse width determination unit 12 may compare the width of the input pulse with each of a first threshold width (n times the unit delay time) and a second threshold width ((m+n) times the unit delay time) greater than the first threshold width, and output a state signal (output of the first AND gate and the second AND gate) indicating the compared result. The output of the first and second AND gates may be input to the output determination unit 13.

Subsequently, based on the first AND gate and the state information, the output determination unit 13 may output a high signal when the width of the input pulse is changed from a state of being smaller than the second threshold width to a state of being greater than the second threshold width, and output a low signal when the width of the input pulse is changed from a state of being greater than the first threshold width to a state of being smaller than the first threshold width.

For this operation, as shown in FIG. 4, the output determination unit 13 may include the switch unit 131 that selects one of the output of the first AND gate and the output of the second AND gate in accordance with a control signal to thereby output the selected one, and the logical circuit unit 132 that receives an output of the switch unit 131 and a reference clock, outputs a signal of a high state when a pulse is generated from the output of the switch unit 131 within the reference clock, and outputs a signal of a low state when the pulse is not generated from the output of the switch unit 131 within the reference clock.

When the operations of the Schmitt trigger circuit that is operated according to the pulse width according to an embodiment start and an output of the Schmitt trigger circuit starts from the low state, an output of the logical circuit unit 132 may be required to be in the low state, and the switch unit 131 having the output of the logical circuit unit 132 as the control signal may receive the control signal of the low state to thereby connect the output (E) of the second AND gate with the logical circuit unit 132. When the width of the input pulse generated by the differential analog signal inputted to the Schmitt trigger circuit due to occurrence of an output of the sensor element is greater than (m+n) times the unit delay time, the pulse may be generated in the output (E) of the second AND gate, and the logical circuit unit 132 may output the signal of the high state. Due to the signal of the high state outputted from the logical circuit unit 132, the switch unit 131 may connect the output (D) of the first AND gate with the logical circuit unit 132. Meanwhile, the output (D) of the first AND gate may continue to generate the pulse when the width of the input pulse is greater than n times the unit delay time, and thereby the output of the logical circuit unit 132 may be maintained to be in the high state. When the width of the input pulse is smaller than n times the unit delay time, the pulse may not be generated in the output (D) of the first AND gate, and the logical circuit unit 132 may convert the output to the signal of the low state because the pulse does not exist during the reference clock. Due to this, the switch unit 131 may connect the output (E) of the second AND gate with the logical circuit unit 132.

In this manner, the signal outputted from the output determination unit 13 may becomes a signal having hysteresis characteristics in which the signal is in the high state when the width of the input pulse is greater than (n+m) times the unit delay time, as shown in FIG. 6, and the signal is in the low state when the width of the input pulse is smaller than n times the unit delay time.

The logical circuit unit 132 may implement the above described operations through a circuit configuration shown in FIG. 5A. As for circuit operations shown in FIG. 5A with reference to FIG. 5B, when a pulse is generated in a signal (Ps) inputted from the switch unit 131 within the reference clock (Clk2), an opposite phase signal of the reference clock (Clk2) may be input to the R terminal of the RS flip-flop 1321, and an output (Ps) of the switch unit 131 may be applied to the S terminal, whereby an output of the RS flip-flop 1321 may output a pulse to be maintained in a high state from a rigging edge of a pulse, existing in the signal (Ps) inputted from the switch unit 131, to a falling edge of the reference clock. In a case in which the output of the RS flip-flop 1321 is delayed to input to the D terminal of the D flip-flop 1322, and the input of the D terminal of the D flip-flop 1322 is in the high state, the output of the D flip-flop 1322 may output the high state when the falling edge of the reference clock (Clk2) is generated. An input of the logical circuit unit 132, that is, an output of the D flip-flop 1322 when the pulse inputted to the S terminal of the RS flip-flop 1321 exists may be maintained to be in the high state. Meanwhile, when the pulse does not input to the S terminal of the RS flip-flop 1321, the output of the RS flip-flop 1321 may be in the low state, and the D terminal of the D flip-flop 1322 may be in the low state in the falling edge of the reference clock (Clk2), whereby the output of the D flip-flop 1322 may be in the low state.

As described above, the Schmitt trigger circuit according to an embodiment may have hysteresis characteristics in which the operating point and the release point are determined according to the width of the pulse. That is, as shown in FIG. 6, a point n times the unit delay time, that is, the first threshold width, may be the release point, a point (n+m) times the unit delay time, that is, the second threshold width may be the operating point.

As set forth above, according to exemplary embodiments of the invention, it may be possible to precisely set the operating point and the release point to be multiples of the unit delay time so that the operating point and the release point are not changed.

Also, according to an embodiment of the present invention, since the analog signal may be received, a pulse width corresponding to a magnitude of the received analog signal may be generated, and the pulse width and a multiple of the unit delay times may be compared, an analog amplifier may not be needed. Accordingly, a circuit for removing an offset of the amplifier may not be needed. Thus, according to an embodiment, the amplifier and an offset removal circuit of the amplifier may be removed, and thereby an implementation area may be reduced, and power consumption and manufacturing costs may be reduced, in comparison with the Schmitt trigger circuit using the analog signals.

In addition, according to exemplary embodiments of the invention, when inevitably using the amplifier, a pulse width indicating a magnitude of analog signals may be significantly increased, thereby reducing sensitivity.

Also, according to exemplary embodiments of the invention, since a digital circuit such as an inverter, logical element, or a flip-flop may be used, thereby reducing power use.

While the present invention has been shown and described in connection with the exemplary embodiments, it will be apparent to those skilled in the art that modification and variation can be made without departing from the spirit and scope of the invention as defined by the appended claims.

What is claimed is:

1. A Schmitt trigger circuit that is operated based on a pulse width, comprising:
 a signal/pulse conversion unit that receives an analog signal to generate an input pulse having a width corresponding to a magnitude of the analog signal;
 a pulse width determination unit that compares the width of the input pulse generated in the signal/pulse conversion unit with a predetermined first threshold width and a second threshold width greater than the first threshold width to output state information indicating the compared result; and
 an output determination unit that outputs a high signal, when the width of the input pulse is changed from a state of being smaller than the second threshold width to a state of being greater than the second threshold width based on the state information, and outputs a low signal when the width of the input pulse is changed from a state of being greater than the first threshold, width to a state of being smaller than the first threshold width based on the state information.

2. The Schmitt trigger circuit according to claim 1, wherein the signal/pulse conversion unit comprises:
- a first inverter that delays a change in a state of an inputted arbitrary clock signal for a first delay time and then inversion-outputs the change in the state;
- a second inverter that delays the change in the state of the clock signal for a second delay time and then inversion-outputs the change in the state;
- a first delay control unit that adjusts the first delay time;
- a second delay control unit that adjusts the second delay time; and
- a pulse generating unit that generates an input pulse having a width corresponding to a difference between the first delay time and the second delay time, and
- wherein the analog signal is a differential analog signal including a first analog signal and a second analog signal, the first delay control unit adjusts the first delay time based on a magnitude of the first analog signal, and the second delay control unit adjusts the second delay time based on a magnitude of the second analog signal.

3. The Schmitt trigger circuit according to claim 2, wherein:
- the first inverter includes a first P-channel Metal-Oxide Semiconductor (PMOS) having a source connected to a power supply voltage, a first N-channel MOS (NMOS) having a drain connected to a drain of the first PMOS and a gate connected to a gate of the first PMOS, and a first capacitor connected between the drain of the first PMOS and a ground,
- the second inverter includes a second PMOS having a source connected to the power supply voltage, a second NMOS having a drain connected to a drain of the second PMOS and a gate connected to a gate of the second PMOS, and a second capacitor connected between the drain of the second PMOS and the ground,
- the first delay control unit includes a third NMOS having a drain connected to a source of the first NMOS and a source connected to the ground,
- the second delay control unit includes a fourth NMOS having a drain connected to a source of the second NMOS and a source connected to the ground,
- the pulse generating unit includes an exclusive OR (XOR) gate that performs an XOR operation on a drain voltage of the first PMOS and a drain voltage of the second PMOS to thereby output a result of the performed XOR operation,
- each of the first analog signal and the second analog signal is applied to a gate of the third NMOS and a gate of the fourth NMOS, and
- the XOR gate outputs the input pulse having a width corresponding to a difference in an output time of the signal of a low state outputted from the drain of the first PMOS and the drain of the second PMOS when the clock signal of a high state is simultaneously applied to the gate of the first PMOS and the gate of the second PMOS.

4. The Schmitt trigger circuit according to claim 1, wherein the pulse width determination unit comprises:
- a plurality of delay circuit units that are connected to each other in series in order that the input pulse is sequentially delayed for a unit delay time; and
- a first AND gate and a second AND gate that receive two pulses from among a group including the input pulse and a plurality of delayed pulses outputted from each of the plurality of delay circuit units to thereby output an overlapped portion between the two pulses as a pulse type, and
- wherein the pulses inputted to each of the first AND gate and the second AND gate include at least one of mutually different pulses, the first AND gate outputs the pulse when the width of the input pulse is larger than m times (m being a natural number) the unit delay time, the second AND gate outputs the pulse when the width of the input pulse is larger than n times (n being a natural number) the unit delay time, the first threshold width is m times the unit delay time, the second threshold width is n times the unit delay time, and an output of each of the first AND gate and the second AND gate is the state information.

5. The Schmitt trigger circuit according to claim 4, wherein:
- the plurality of delay circuit units includes (m+n) delay circuit units that are connected to each other in series,
- the first AND gate receives an output of an m-th delay circuit unit and an output of the (m+n)-th delay circuit unit, and performs a mutual OR operation on the received outputs to thereby output a result of the performed mutual OR operation, and
- the second AND gate receives the input pulse and the output of the (m+n)-th delay circuit unit, and performs the mutual OR operation on the received input pulse and output of the (m+n)-th delay circuit unit to thereby output a result of the performed mutual OR operation.

6. The Schmitt trigger circuit according to claim 4, wherein the delay circuit unit comprises a PMOS having a source connected to a power supply voltage, an NMOS having a drain connected to a drain of the PMOS and a gate connected to a gate of the PMOS, and a capacitor connected between the drain of the PMOS and a ground.

7. The Schmitt trigger circuit according to claim 5, wherein the delay circuit unit comprises a PMOS having a source connected to a power supply voltage, an NMOS having a drain connected to a drain of the PMOS and a gate connected to a gate of the PMOS, and a capacitor connected between the drain of the PMOS and a ground.

8. The Schmitt trigger circuit according to claim 4, wherein the output determination unit comprises:
- a switch unit that selects one of the output of the first AND gate and the output of the second AND gate according to a control signal, and outputs the selected one; and
- a logical circuit unit that receives the output of the switch unit and a reference clock, outputs a signal of a high state when a pulse is generated from the output of the switch unit within the reference clock, and outputs a signal of a low state when the pulse is not generated from the output of the switch unit within the reference clock, and
- wherein the output of the logical circuit unit is the control signal.

9. The Schmitt trigger circuit according to claim 5, wherein the output determination unit comprises:
- a switch unit that selects one of the output of the first AND gate and the output of the second AND gate according to a control signal, and outputs the selected one; and
- a logical circuit unit that receives the output of the switch unit and a reference clock, outputs a signal of a high state when a pulse is generated from the output of the switch unit within the reference clock, and outputs a signal of a low state when the pulse is not generated from the output of the switch unit within the reference clock, and
- wherein the output of the logical circuit unit is the control signal.

10. The Schmitt trigger circuit according to claim 8, wherein the switch unit outputs the output of the first AND gate when the control signal is in the high state, and outputs the output of the second AND gate when the control signal is in the low state.

11. The Schmitt trigger circuit according to claim 9, wherein the switch unit outputs the output of the first AND gate when the control signal is in the high state, and outputs the output of the second AND gate when the control signal is in the low state.

12. The schimitt trigger circuit according to claim 8, wherein the logical circuit unit comprises:
   an RS flip-flop that has an "S" terminal to which the output of the switch unit is inputted and an "R" terminal to which an opposite phase signal of the reference clock is inputted; and
   a fall edge triggered D flip-flop that has a "D" terminal to which an output of the RS flip-flop is inputted and a clock input terminal to which the reference clock is inputted, and
   wherein an output of the fall edge triggered D flip-flop is an output of the output determination unit.

13. The schimitt trigger circuit according to claim 9, wherein the logical circuit unit comprises:
   an RS flip-flop that has an "S" terminal to which the output of the switch unit is inputted and an "R" terminal to which an opposite phase signal of the reference clock is inputted; and
   a fall edge triggered D flip-flop that has a "D" terminal to which an output of the RS flip-flop is inputted and a clock input terminal to which the reference clock is inputted, and
   wherein an output of the fall edge triggered D flip-flop is an output of the output determination unit.

14. A Schmitt trigger circuit that is operated based on to a pulse width, comprising:
   a signal/pulse conversion unit that receives an analog signal to generate an input pulse having a width corresponding to a magnitude of the analog signal;
   a pulse width determination unit that includes (m+n) delay circuit units connected to each other in series in order that the input pulse is sequentially delayed for a unit delay time, a first AND gate receiving an output of an m-th delay circuit unit and an output of an (m+n)-th delay circuit unit and performing a mutual OR operation on the received outputs to thereby output a result of the performed mutual OR operation, and a second AND gate receiving the input pulse and the output of the (m+n)-th delay circuit unit, and performing the mutual OR operation on the received input pulse and output of the (m+n)-th delay circuit unit to thereby output a result of the performed mutual OR operation; and
   an output determination unit that includes a switch unit receiving a control signal, outputting an output of the first AND gate when the control signal is in a high state, and outputting an output of the second AND gate when the control signal is in a low state, and a logical circuit unit receiving the output of the switch unit and a reference clock, outputting a signal of a high state when a pulse is generated from the output of the switch unit within the reference clock, and outputting a signal of a low state when the pulse is not generated from the output of the switch unit within the reference clock, wherein the output of the logical circuit unit is the control signal.

15. The Schmitt trigger circuit according to claim 14, wherein the signal/pulse conversion unit comprises:
   a first inverter that includes a first PMOS having a source connected to a power supply voltage, a first NMOS having a drain connected to a drain of the first PMOS and a gate connected to a gate of the first PMOS, and a first capacitor connected between the drain of the first PMOS and a ground;
   a second inverter that includes a second PMOS having a source connected to the power supply voltage, a second NMOS having a drain connected to a drain of the second PMOS and a gate connected to a gate of the second PMOS, and a second capacitor connected between the drain of the second PMOS and the ground;
   a third NMOS that has a drain connected to a source of the first NMOS and a source connected to the ground;
   fourth NMOS that has a drain connected to a source of the second NMOS and a source connected to the ground; and
   an XOR gate that performs an XOR operation on a drain voltage of the first PMOS and a drain voltage of the second PMOS to thereby output a result of the performed XOR operation, and
   wherein the analog signal is a differential analog signal including a first analog signal and a second analog signal, each of the first analog signal and the second analog signal is applied to a gate of the third NMOS and a gate of the fourth NMOS, and the XOR gate outputs the input pulse having a width corresponding to a difference in an output time of the signal of the low state outputted from each of the drain of the first PMOS and the drain of the second PMOS after the signal of a high state is applied to the gate of the first PMOS and the gate of the second PMOS.

16. The Schmitt trigger circuit according to claim 14, wherein the logical circuit unit comprises:
   an RS flip-flop that has an "S" terminal to which the output of the switch unit is inputted and an "R" terminal to which an opposite phase signal of the reference clock is inputted; and
   a fall edge triggered D flip-flop that has a "D" terminal to which an output of the RS flip-flop is inputted and a clock input terminal to which the reference clock is inputted, and
   wherein an output of the fall edge triggered D flip-flop is an output of the output determination unit.

* * * * *